US009165947B2

(12) United States Patent
Yan et al.

(10) Patent No.: US 9,165,947 B2
(45) Date of Patent: Oct. 20, 2015

(54) SEMICONDUCTOR DEVICE, TFT, CAPACITOR AND METHOD OF MANUFACTURING THE SAME

(75) Inventors: Jing-Yi Yan, Hsinchu County (TW); Chih-Chieh Hsu, Hsinchu (TW); Hsiao-Chiang Yao, Kaohsiung (TW); Chu-Yin Hung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 6 days.

(21) Appl. No.: 13/427,904

(22) Filed: Mar. 23, 2012

(65) Prior Publication Data

US 2013/0140635 A1 Jun. 6, 2013

(30) Foreign Application Priority Data

Dec. 2, 2011 (TW) .............................. 100144384 A

(51) Int. Cl.
H01L 29/786 (2006.01)
H01L 27/12 (2006.01)
H01L 21/336 (2006.01)

(52) U.S. Cl.
CPC ........ H01L 27/1225 (2013.01); H01L 27/1255 (2013.01)

(58) Field of Classification Search
CPC ............ H01L 27/1251; H01L 27/1222; H01L 27/1225; H01L 27/3265; H01L 27/1214; H01L 27/1255; H01L 27/1237
USPC .......................... 257/43, 59, 72; 438/149, 158
See application file for complete search history.

(56) References Cited

U.S. PATENT DOCUMENTS

| 6,653,159 B2 | 11/2003 | Wu |
| 6,746,959 B2 | 6/2004 | Lyu |
| 7,050,137 B2 | 5/2006 | Hoshino et al. |
| 7,968,879 B2 | 6/2011 | Yamazaki |
| 2004/0147065 A1* | 7/2004 | Kitakado et al. .............. 438/151 |

(Continued)

FOREIGN PATENT DOCUMENTS

| TW | 201115743 | 5/2011 |
| TW | 201123309 | 7/2011 |

OTHER PUBLICATIONS

Kim et al, "High mobility bottom gate InGaZnO thin film transistors with SiOx etch stopper", Applied Physics Letters, vol. 90, 2007, pp. 212114-1-212114-3.

(Continued)

*Primary Examiner* — Khiem D Nguyen
*Assistant Examiner* — Pauline Vu
(74) *Attorney, Agent, or Firm* — Jianq Chyun IP Office

(57) ABSTRACT

A semiconductor device includes a gate, a first electrode, a first insulating layer, an active layer, an etching stop layer, a second insulating layer, a source, a drain and a second electrode. The first insulating layer covers the gate and the first electrode. The active layer and the etching stop layer are disposed on the first insulating layer above the gate and the first electrode respectively. The second insulating layer covers the active layer and the etching stop layer and has a first opening and a second opening exposing the active layer and a third opening exposing the etching stop layer. The source and the drain are disposed on the second insulating layer and contact with the active layer through the first opening and the second opening respectively. The second electrode is located on the second insulating layer and contacts with the etching stop layer through the third opening.

2 Claims, 8 Drawing Sheets

(56) References Cited

U.S. PATENT DOCUMENTS

| | | | |
|---|---|---|---|
| 2006/0238667 A1* | 10/2006 | Lee et al. | 349/43 |
| 2006/0267491 A1* | 11/2006 | Koo et al. | 313/511 |
| 2008/0224133 A1* | 9/2008 | Park et al. | 257/43 |
| 2009/0101895 A1* | 4/2009 | Kawamura et al. | 257/43 |
| 2009/0141203 A1* | 6/2009 | Son et al. | 349/39 |
| 2009/0278131 A1* | 11/2009 | Kwon et al. | 257/72 |
| 2009/0321731 A1 | 12/2009 | Jeong et al. | |
| 2010/0140613 A1* | 6/2010 | Kimura | 257/43 |
| 2010/0301328 A1* | 12/2010 | Yamazaki et al. | 257/43 |
| 2011/0024751 A1 | 2/2011 | Yamazaki et al. | |
| 2011/0031491 A1 | 2/2011 | Yamazaki et al. | |
| 2011/0042670 A1 | 2/2011 | Sato et al. | |
| 2011/0058116 A1* | 3/2011 | Yamazaki et al. | 349/43 |
| 2011/0073856 A1 | 3/2011 | Sato et al. | |
| 2011/0104833 A1* | 5/2011 | Kang et al. | 438/23 |
| 2011/0108831 A1* | 5/2011 | Jeong et al. | 257/43 |
| 2011/0136302 A1* | 6/2011 | Yamazaki et al. | 438/156 |
| 2011/0140115 A1* | 6/2011 | Ahn | 257/59 |
| 2011/0147740 A1* | 6/2011 | Jeong et al. | 257/43 |
| 2011/0168997 A1* | 7/2011 | Lee et al. | 257/57 |
| 2011/0220888 A1* | 9/2011 | Choi et al. | 257/43 |
| 2012/0146035 A1* | 6/2012 | Kuwabara | 257/59 |

OTHER PUBLICATIONS

Chen et al., "Light-induced istability of an InGaZnO thin film transistor with and without SIOx passivation layer formed by plasma-enhanced-chemical-vapor-deposition", Applied Physics Letters, vol. 97, Nov. 8, 2010, pp. 192103-1-192103-3.

Kim et al., "New Approach for Passivation of Ga2O3—In2O3—ZnO Thin Film Transistors", 2007 IEEE, 2007, pp. 583-586.

Kim et al., "High Reliable and Manufacturable Gallium Indium Zinc Oxide Thin-Film Transistors Using the Double Layers as an Active Layer", Journal of the Electrochemical Society, vol. 156, Issue 3, Jan. 12, 2009, pp. H184-H187.

Lim et al., "Improve in bias stability of amorphous-InGaZnO4 thin film transistors with SIOx passivation layers", Journal of Vacuum Science & Technology B, vol. 28, Issue 1, Jan. 13, 2010, pp. 116-119.

Son et al., "Threshold Voltage Control of Amorphous Gallium Indium Zinc Oixde TFTs by Suppressing Back-Channel Current", Electrochemical and Solid-State Letters, vol. 12, Issue 1, Nov. 6, 2008, pp. H26-H28.

\* cited by examiner

SEMICONDUCTOR DEVICE, TFT, CAPACITOR AND METHOD OF MANUFACTURING THE SAME

CROSS-REFERENCE TO RELATED APPLICATION

This application claims the priority benefit of Taiwan application serial no. 100144384, filed on Dec. 2, 2011. The entirety of the above-mentioned patent application is hereby incorporated by reference herein and made a part of this specification.

TECHNICAL FIELD

The present disclosure relates to a semiconductor device and a method of manufacturing the same. More particularly, the present disclosure relates to a semiconductor device including a thin film transistor and a capacitor and a method of manufacturing the same.

BACKGROUND

As modern information technology advances, various types of displays have been widely used in screens for consumer electronic products such as mobile phones, notebook computers, digital cameras, and personal digital assistants (PDAs). Among these displays, liquid crystal displays (LCD) and organic electroluminescence displays (OELD) are the prevailing products in the market due to their advantages of being light-weight, compact, and low in power-consumption. The manufacturing process for both LCD and OELD includes forming semiconductor devices arranged in array on a substrate and the semiconductor devices include thin film transistors (TFTs).

In the conventional TFT array substrates, an amorphous silicon (α-Si) TFT or a low temperature polysilicon TFT is usually adopted as a switching device of each of a plurality of sub-pixels. In recent studies, oxide semiconductor TFTs have higher mobility comparing to α-Si TFTs and have better threshold voltage uniformity (Vth) comparing to low temperature TFTs. Thus, oxide semiconductor TFTs have the potential of becoming the key element in flat displays of the next generation.

If active layers of the TFTs are influenced by subsequent processes to occur electric shifting, the electric reliability of the TFTs is decreased, especially, the oxide semiconductor TFTs are acuter in this issue. Therefore, how to improve the stability of the active layers in TFTs is important in recent researches.

SUMMARY

A semiconductor device includes a substrate, a gate, a first electrode, a first insulating layer, an active layer, an etching stop layer, a second insulating layer, a source, a drain and a second electrode. The first insulating layer covers the gate and the first electrode. The active layer and the etching stop layer are disposed on the first insulating layer above the gate and the first electrode respectively. The second insulating layer covers the active layer and the etching stop layer and has a first opening, a second opening and a third opening, the first opening and the second opening expose the active layer, and the third opening exposes the etching stop layer. The source and the drain are disposed on the second insulating layer and contact with the active layer through the first opening and the second opening respectively. The second electrode is located on the second insulating layer and contacts with the etching stop layer through the third opening.

A method of manufacturing a semiconductor device is provided. A first conductive layer is formed on a substrate, and the first conductive layer includes a gate and a first electrode. A first insulating layer is formed to cover the first conductive layer. A semiconductor layer is formed on the first insulating layer, and the semiconductor layer includes an active layer and an etching stop layer. A second insulating layer is formed on the semiconductor layer. The second insulating layer is patterned to form a first opening, a second opening and a third opening, the first opening and the second opening expose the active layer, and the third opening exposes the etching stop layer. A second conductive layer is formed on the second insulating layer, and the second conductive layer includes a source, a drain and a second electrode. The source and the drain contact with the active layer through the first opening and the second opening, and the second electrode contacts with the etching stop layer through the third opening.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The disclosure provides a semiconductor device and a manufacturing method thereof which adopt etching selectivity between a semiconductor material and an insulating material to protect an active layer of a semiconductor layer from etching damage, so as to keep original electric characteristic of the active layer. In addition, the quality of the capacitor can also be controlled through the arrangement of an etching stop layer of the semiconductor layer. Accordingly, the stability of the active layer of a TFT can be improved.

Figure 1A:
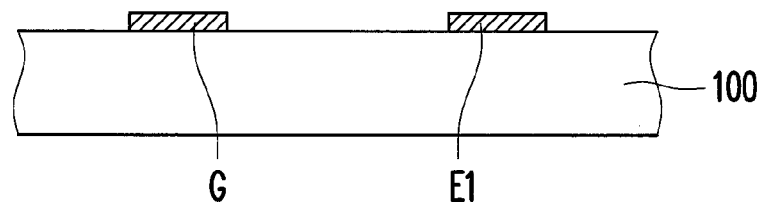
FIG. 1A to FIG. 1D are schematic cross-sectional views showing a method of manufacturing a semiconductor device according to an exemplary embodiment.

FIG. 1A to FIG. 1D are schematic cross-sectional views showing a method of manufacturing a semiconductor device according to an exemplary embodiment. Referring to FIG. 1A, a substrate 100 is provided. The substrate 100 is used to carry devices or film layers and can be made of glass, quartz, an organic polymer, an opaque/reflective material, for example.

A first conductive layer M1 including a gate G and a first electrode E1 is formed on the substrate 100. In consideration of electrical conductivity, the first conductive layer M1 is often made of metal materials. However, the disclosure is not limited thereto. According to other exemplary embodiments of the disclosure, the first conductive layer M1 can also be made of other conductive materials. The metal material includes, for example, an alloy, metal nitride, metal oxide, metal oxynitride, another appropriate material, or a layer in which the metal material and any other conductive material are stacked to each other. In the exemplary embodiment, the first conductive layer M1 is formed by forming a conductive layer with a depositing process and then the conductive layer is patterned with a photolithographic and etching process so as to define the gate G and the first electrode E1, which should not be construed as a limitation to the disclosure. The process for forming the first conductive layer M1 is referred to a first mask process.

Figure 1B:
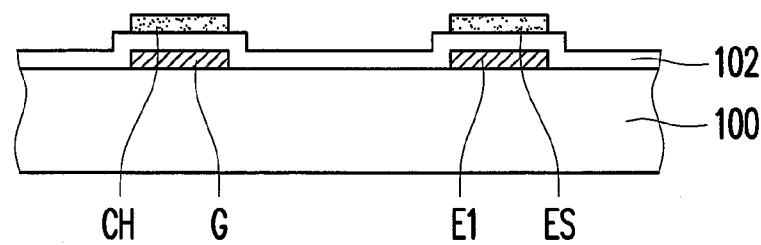

Referring to FIG. 1B, a first insulating layer 102 is formed on the substrate 100 to cover the first conductive layer M1 (the gate G1 and the first electrode E1). The first insulating layer 102 can be made of an inorganic material (such as silicon oxide, silicon nitride, or silicon oxynitride), an organic material or a combination thereof.

A semiconductor layer SE is formed on the first insulating layer 102, and the semiconductor layer SE comprises an active layer CH and an etching stop layer ES. The semiconductor layer SE comprises a metal oxide semiconductor material, an amorphous silicon material, a polysilicon material or a micro-crystal silicon material, and preferably, the semiconductor layer SE comprises the metal oxide semiconductor material. The metal oxide semiconductor material comprises indium-gallium-zinc oxide (IGZO), zinc oxide (ZnO), tin oxide (SnO), indium-zinc Oxide (IZO), gallium-zinc oxide (GZO), zinc-tin oxide (ZTO), indium-tin oxide (ITO), or a combination thereof, or a layer in which metal oxide semiconductor materials are stacked to each other. In the exemplary embodiment, the semiconductor layer SE is formed by forming a semiconductor material with a depositing process and then the semiconductor material is patterned with a photolithographic and etching process so as to define the active layer CH on the first insulating layer 102 above the gate G and define the first electrode E1 on the first insulating layer 102 above the first electrode E1, which should not be construed as a limitation to the disclosure. The process for forming the semiconductor layer SE is referred to a second mask process.

Figure 1C:
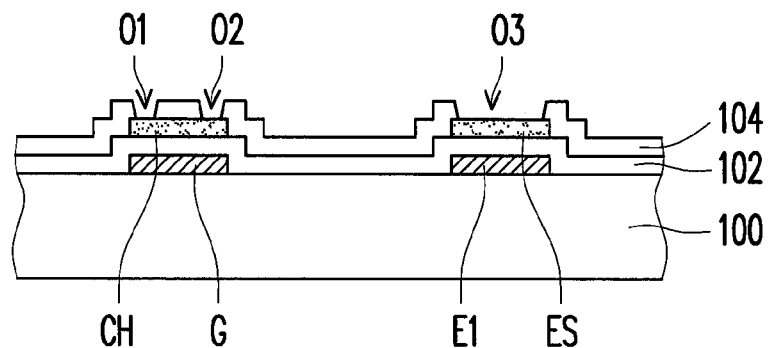

Referring to FIG. 1C, a second insulating layer 104 is formed on the substrate 100 to cover the semiconductor layer SE. The second insulating layer 104 can be made of an inorganic material (such as silicon oxide, silicon nitride, or silicon oxynitride), an organic material or a combination thereof.

The second insulating layer 104 is patterned to form a first opening O1, a second opening O2 and a third opening O3, the first opening O1 and the second opening O2 expose the active layer CH, and the third opening O3 exposes the etching stop layer ES. For detail, the first opening O1 and the second opening O2 expose two edge regions of the active layer CH, and the active layer CH between the first opening O1 and the second opening O2 (a middle region of the active layer CH) is still protected by the second insulating layer 104, such that the active layer CH between the first opening O1 and the second opening O2 may also be referred to a channel protecting layer. In addition, the third opening O3 exposes the most part of the etching stop layer ES. The second insulating layer 104 is patterned by a photolithographic and etching process, for instance. The process for pattering the second insulating layer 104 is referred to a third mask process.

It is noted that, during pattering the second insulating layer 104 (the third mask process), the etching selectivity between the second insulating layer 104 and the semiconductor layer SE is adjusted, such that the etching process for pattering the second insulating layer 104 can accurately stop on the semiconductor layer SE.

Figure 1D:
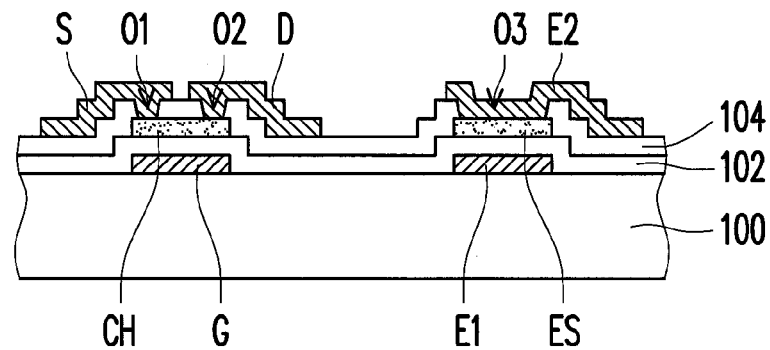

Referring to FIG. 1D, a second conductive layer M2 is formed on the second insulating layer 104, and the second conductive layer M2 comprises a source S, a drain D and a second electrode E2. The source S and the drain D contact with the active layer CH through the first opening O1 and the second opening O2 respectively, and the second electrode E2 contacts with the etching stop layer ES through the third opening O3. In consideration of electrical conductivity, the second conductive layer M2 is often made of metal materials. However, the disclosure is not limited thereto. According to other exemplary embodiments of the disclosure, the second conductive layer M2 can also be made of other conductive materials. The metal material includes, for example, an alloy, metal nitride, metal oxide, metal oxynitride, another appropriate material, or a layer in which the metal material and any other conductive material are stacked to each other. In the exemplary embodiment, the second conductive layer M2 is formed by forming a conductive layer with a depositing process and then the conductive layer is patterned with a photolithographic and etching process so as to define the source S and the drain D on the active layer CH and define the second electrode E2 on the etching stop layer ES, which should not be construed as a limitation to the disclosure. The process for forming the second conductive layer M2 is referred to a fourth mask process.

Accordingly, the gate G, the active layer CH, the source S and the drain D form a thin film transistor. The first electrode E1 and the second electrode E2 form a capacitor. It is noted that, the etching stop layer ES contacting with the second electrode E2 is a semiconductor material, and the etching stop layer ES presents electric conduction characteristic when the device is operated, such that the etching stop layer ES may act as a part of the second electrode E2. Namely, the capacitor is formed by the first electrode E1 which acts as a bottom electrode, the etching stop layer ES and the second electrode E2 which act as a top electrode, and the first insulating layer 102 between the bottom electrode and the top electrode which acts as a capacitor dielectric layer.

The semiconductor device formed with the foregoing processes is as shown in FIG. 1D, which comprises a gate G, a first electrode E1, a first insulating layer 102, an active layer CH, an etching stop layer ES, a second insulating layer 104, a source S, a drain D and a second electrode E2. The first insulating layer 102 covers the gate G and the first electrode E1. The active layer CH and the etching stop layer ES are disposed on the first insulating layer 102 above the gate G and the first electrode E1 respectively. The second insulating layer 104 covers the active layer CH and the etching stop layer ES and has a first opening O1, a second opening O2 and a third opening O3. The first opening O1 and the second opening 2 expose the active layer CH, and the third opening O3 exposes the etching stop layer ES. The source S and the drain D are disposed on the second insulating layer 104 and contact with the active layer CH through the first opening O1 and the second opening O2 respectively. The second electrode E2 is located on the second insulating layer 104 and contacts with the etching stop layer ES through the third opening O3.

Figure 2:
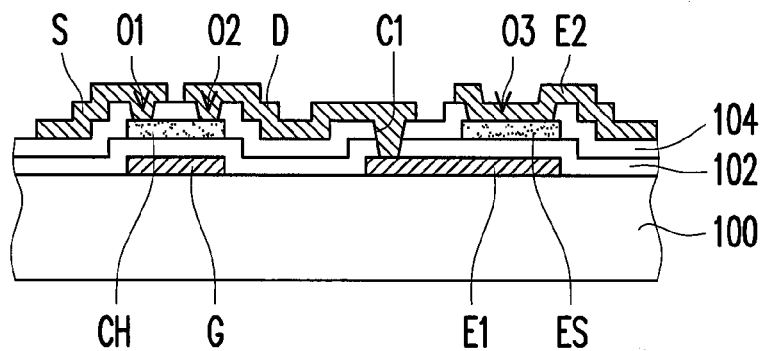
FIG. 2 to FIG. 10 are schematic cross-sectional views showing a semiconductor device according to several exemplary embodiments.

FIG. 2 is schematic cross-sectional view showing a semiconductor device according to an exemplary embodiment. Referring to FIG. 2, the exemplary embodiment of FIG. 2 is similar to the exemplary embodiment of FIG. 1D, so that the same devices are denoted by the same symbols, and descriptions thereof are not repeated. In the exemplary embodiment of FIG. 2, the drain D of the thin film transistor is further electrically connected to the first electrode E1 through a contact opening C1. Namely, the drain D of the thin film transistor and the first electrode E1 of the capacitor are in the same electric potential. In addition, the second electrode E2 of the capacitor is electrically connected to another voltage (a common voltage, for example), such that a capacitance is formed between the first electrode E1 and the second electrode E2.

Figure 3:
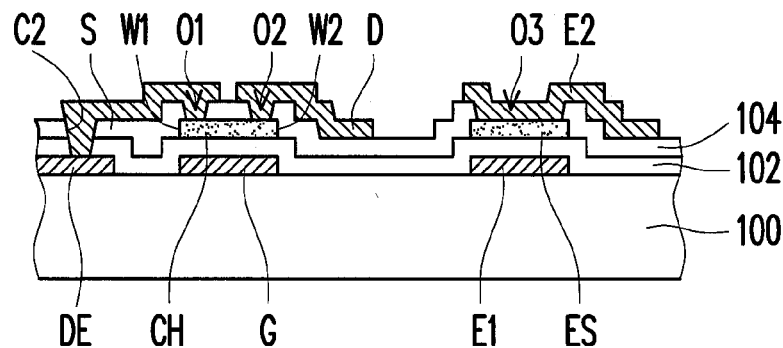

FIG. 3 is schematic cross-sectional view showing a semiconductor device according to an exemplary embodiment. Referring to FIG. 3, the exemplary embodiment of FIG. 3 is similar to the exemplary embodiment of FIG. 1D, so that the same devices are denoted by the same symbols, and descriptions thereof are not repeated. In the exemplary embodiment of FIG. 3, the drain D of the thin film transistor is electrically connected to a device DE through a contact opening C2. The device DE is, for example, a thin film transistor or other type switching devices. Generally, a pixel structure of an organic electroluminescence display is formed by at least two thin film transistors and at least one capacitor. If the thin film transistor and the capacitor shown in FIG. 1D are applied to the pixel structure of the organic electroluminescence display, the source S of the thin film transistor is electrically connected to the device DE (such as a thin film transistor).

Figure 4:
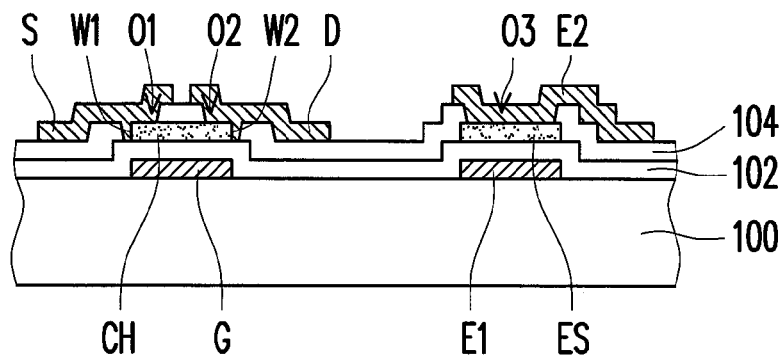

FIG. 4 is schematic cross-sectional view showing a semiconductor device according to an exemplary embodiment. Referring to FIG. 4, the exemplary embodiment of FIG. 4 is similar to the exemplary embodiment of FIG. 1D, so that the same devices are denoted by the same symbols, and descriptions thereof are not repeated. In the exemplary embodiment of FIG. 4, the first opening O1 and the second opening O2 further expose two sides W1, W2 of the active layer CH in addition to the two edge region of the active layer CH, and the source S and the drain D contact with the two exposed sides W1, W2 of the active layer CH. Because the first opening O1 and the second opening O2 further expose two sides W1, W2 of the active layer CH in addition to the two edge region of the active layer CH, a contact area between the active layer CH and the source S and the drain D is larger.

Figure 5:
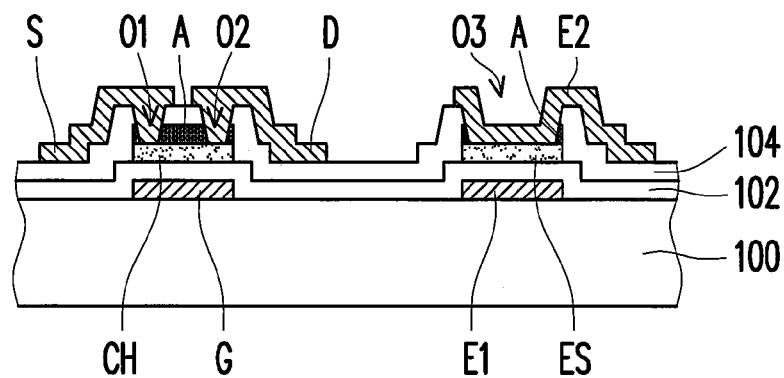

FIG. 5 is schematic cross-sectional view showing a semiconductor device according to an exemplary embodiment. Referring to FIG. 5, the exemplary embodiment of FIG. 5 is similar to the exemplary embodiment of FIG. 1D, so that the same devices are denoted by the same symbols, and descriptions thereof are not repeated. In the exemplary embodiment of FIG. 5, a protecting auxiliary layer A is further formed on the active layer CH and the etching stop layer ES, and the first opening O1, the second opening O2 and the third opening O3 pass through the protecting auxiliary layer A. The protecting auxiliary layer A is referred to a channel protecting auxiliary layer which aids the protection of the active layer CH between the first opening O1 and the second opening O2. The protecting auxiliary layer A comprises an inorganic material (such as silicon oxide, silicon nitride, or silicon oxynitride), an organic material or a combination thereof. According to the exemplary embodiment, the protecting auxiliary layer A and the semiconductor layer SE are formed with the same mask (the second mask process). Namely, before defining the semiconductor layer SE, the semiconductor material and an auxiliary material are sequentially formed with depositing processes, and then the semiconductor material and the auxiliary material are patterned with the photolithographic and etching process to define the semiconductor layer SE and the protecting auxiliary layer A simultaneously. Thereafter, when the second insulating layer 104 is patterned (the third mask process), the semiconductor layer SE and the protecting auxiliary layer A is etched to form the first opening O1, the second opening O2 and the third opening O3 through adjusting the etching process recipes, and the etching process can be accurately stopped on the semiconductor layer SE.

Figure 6:
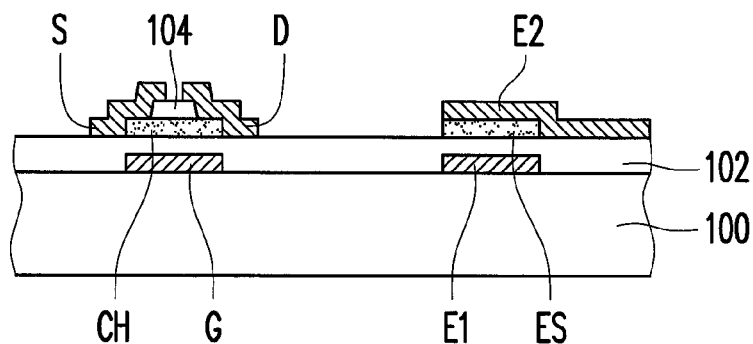

FIG. 6 is schematic cross-sectional view showing a semiconductor device according to an exemplary embodiment. Referring to FIG. 6, the exemplary embodiment of FIG. 6 is similar to the exemplary embodiment of FIG. 1D, so that the same devices are denoted by the same symbols, and descriptions thereof are not repeated. In the exemplary embodiment of FIG. 6, the most part of the second insulating layer 104 is removed and only the second insulating layer 104 on the active layer CH is remained to server as the channel protecting layer. Since the most part of the second insulating layer 104 is removed, the source S and the drain D not only contact with the edge regions of the active layer CH but also contact with the two sides of the active layer CH. In addition, the second electrode E2 also directly contacts with the etching stop layer ES.

Figure 7:
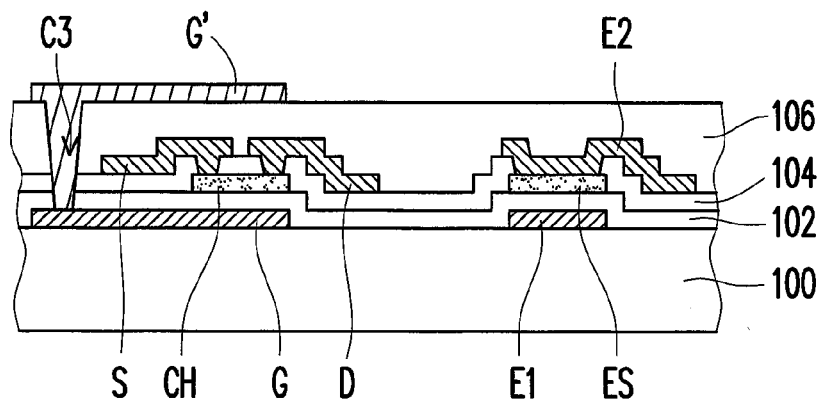

FIG. 7 is schematic cross-sectional view showing a semiconductor device according to an exemplary embodiment. Referring to FIG. 7, the exemplary embodiment of FIG. 7 is similar to the exemplary embodiment of FIG. 1D, so that the same devices are denoted by the same symbols, and descriptions thereof are not repeated. In the exemplary embodiment of FIG. 7, after forming the second conductive layer M2, a third insulating layer 106 is further formed on the second insulating layer 104 to cover the source S, the drain D and the second electrode E2. The third insulating layer 106 can be made of an inorganic material (such as silicon oxide, silicon nitride, or silicon oxynitride), an organic material or a combination thereof. Then, a top gate G' is formed on the third insulating layer 106 above the active layer CH. In the exemplary embodiment, the thin film transistor is a dual gate thin film transistor.

According to the exemplary embodiment, before forming the top gate G', a contact opening C3 is further formed in the third insulating layer 106, the second insulating layer 104 and the first insulating layer 102, such that the top gate G' can be electrically connected to the gate G through the contact opening C3. Herein, a material of the gate G and a material of the top gate G' can be the same or different, which respectively comprise a metal material, an alloy, metal nitride, metal oxide, metal oxynitride or a combination thereof. Since the top gate G' is electrically connected to the gate G through the contact opening C3, the top gate G' and the gate G have the same voltage signal.

Figure 8:
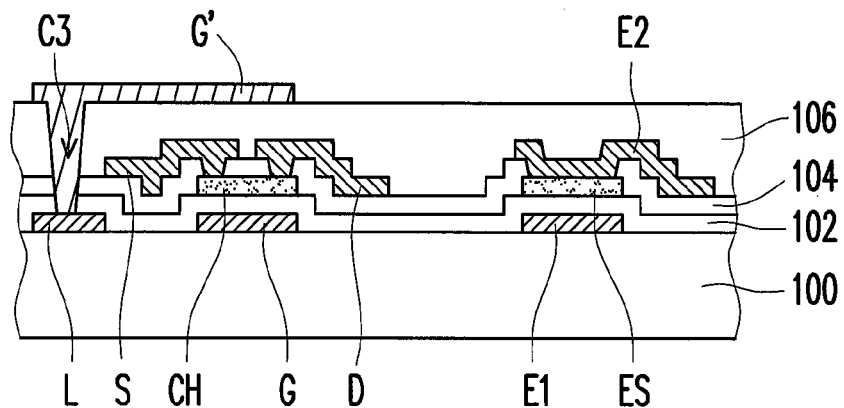

FIG. 8 is schematic cross-sectional view showing a semiconductor device according to an exemplary embodiment. Referring to FIG. 8, the exemplary embodiment of FIG. 8 is similar to the exemplary embodiment of FIG. 7, so that the same devices are denoted by the same symbols, and descriptions thereof are not repeated. In the exemplary embodiment of FIG. 8, the top gate G' is not electrically connected to the gate G but electrically connected to a conductive line L. Namely, the top gate G' is electrically connected to the conductive line L through the contact opening C3. The conductive line L may be electrically connected to an external circuit, and therefore the gate G and the top gate G' are controlled by corresponding conductive lines respectively. In particular, in the exemplary embodiment, the conductive line L and the gate G are in the same film layer. Namely, the conductive line L is a part of the first conductive layer M1, and the conductive line L is defined in the first mask process.

Figure 9:
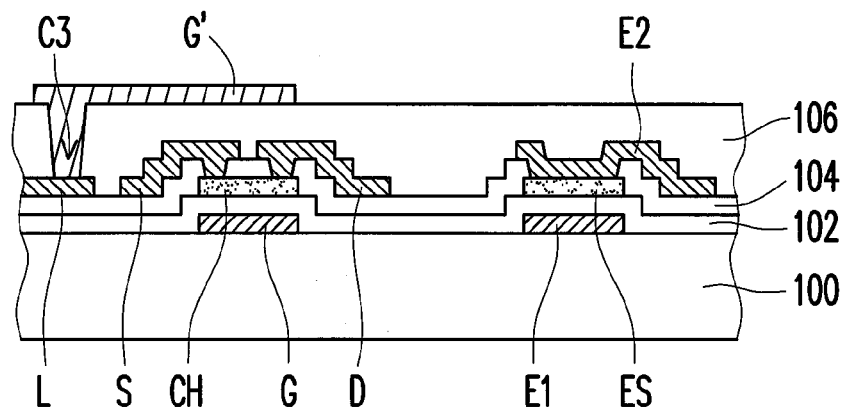

FIG. 9 is schematic cross-sectional view showing a semiconductor device according to an exemplary embodiment. Referring to FIG. 9, the exemplary embodiment of FIG. 9 is similar to the exemplary embodiment of FIG. 8, so that the same devices are denoted by the same symbols, and descriptions thereof are not repeated. In the exemplary embodiment of FIG. 9, the top gate G' is electrically connected to the conductive line L through the contact opening C3. In particular, in the exemplary embodiment, the conductive line L and the source S and the drain D are in the same film layer. Namely, the conductive line L belongs to a part of the second conductive layer M2, and the conductive line L is defined in the fourth mask process. Herein, because the conductive line L is electrically connected to the external circuit, the gate G and the top gate G' are respectively controlled by corresponding conductive lines.

Figure 10:
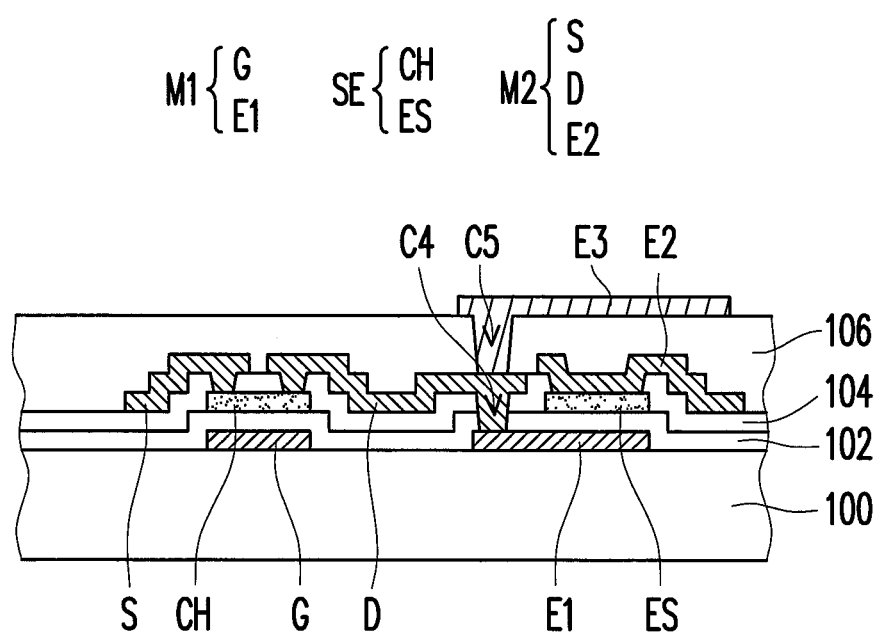

FIG. 10 is schematic cross-sectional view showing a semiconductor device according to an exemplary embodiment. Referring to FIG. 10, the exemplary embodiment of FIG. 10 is similar to the exemplary embodiment of FIG. 9, so that the same devices are denoted by the same symbols, and descriptions thereof are not repeated. In the exemplary embodiment of FIG. 10, a third electrode E3 is further disposed on the third insulating layer 106, and the third electrode E3 is disposed above the second electrode E2. In the exemplary embodiment, the third electrode E3 is electrically connected to the drain D through a contact opening C5, and the drain D is electrically connected to the first electrode E1 through a contact opening C4, and thus the third electrode E3 is electrically connected to the first electrode E1 through the contact openings C5, C4, which should not be construed as a limitation to the disclosure. According to another exemplary embodiment, the third electrode E3 may also be electrically connected to the first electrode E1 through other contact structures.

In the exemplary embodiment, the capacitor is formed by the first electrode E1, the second electrode E2 and the third electrode E3, such that the capacitor is formed through electrically connecting a sub-capacitor which is formed by the first electrode E1 and the second electrode E2 and a sub-capacitor formed which is formed by the second electrode E2 and the third electrode E3 in parallel. Therefore, an area of the capacitor can be reduced based on a premise that the capacitance of the capacitor is maintained.

Figure 11A:
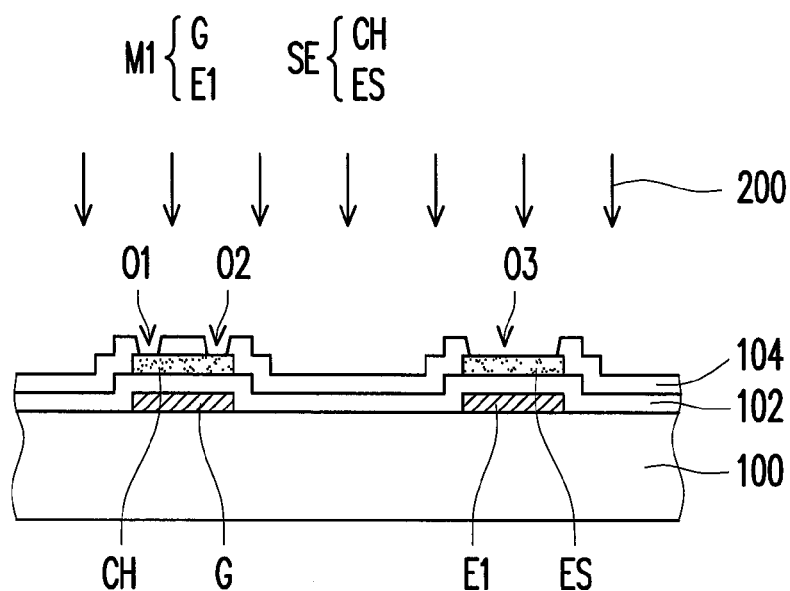
FIG. 11A to FIG. 11B are schematic cross-sectional views showing a method of manufacturing a semiconductor device according to an exemplary embodiment.
Figure 11B:
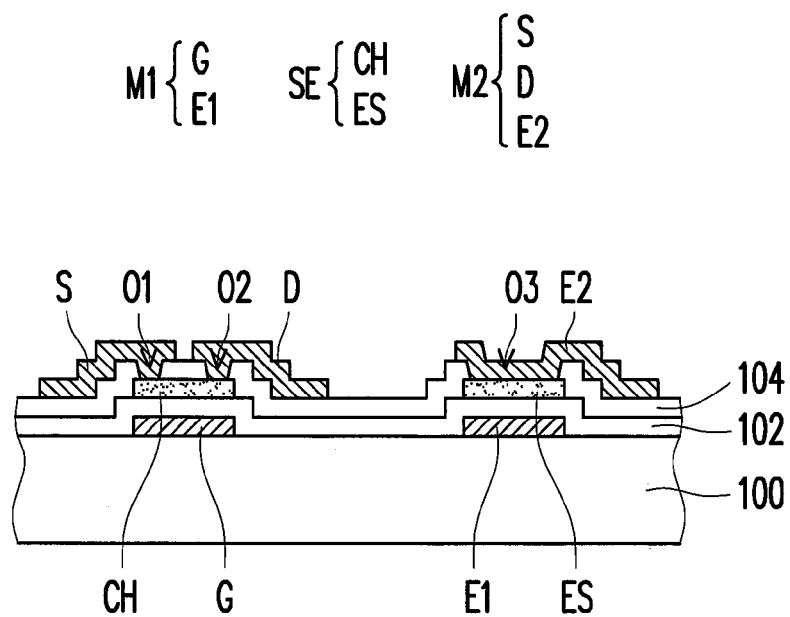

FIG. 11A to FIG. 11B are schematic cross-sectional views showing a method of manufacturing a semiconductor device according to an exemplary embodiment. In the exemplary embodiment, the steps shown in FIG. 1A to FIG. 1C are performed so as to form the first opening O1, the second opening O2 and the third opening O3 in the second insulating layer 104. After that, as shown in FIG. 11A, a plasma treatment 200 is performed. The plasma treatment 200 comprises an argon gas plasma treatment, an oxygen gas plasma treatment or a helium gas plasma treatment, for example. Because the second insulating layer 104 has the first opening O1, the second opening O2 and the third opening O3, the active layer CH and the etching stop layer ES exposed by the first opening O1, the second opening O2 and the third opening O3 are treated by the plasma treatment 200, so as to decrease a resistance of the active layer CH and decrease a resistance of the etching stop layer ES. Therefore, the electric contact between the active layer CH and the source S and the drain and the electric contact between the second electrode E2 and the etching stop layer ES can be improved.

As shown in FIG. 11B, the second conductive layer M2 is formed on the second insulating layer 104, and the second conductive layer M2 includes the source S, the drain D and the second electrode E2. The source S and the drain D contact with the active layer CH through the first opening O1 and the second opening O2 respectively, and the second electrode E2 contacts with the etching stop layer ES through the third opening O3. This step is the same or similar to the step of FIG. 1D, and descriptions thereof are not repeated.

Table 1 shows resistances of a semiconductor material (IGZO is taken as an example) before the plasma treatment and after the plasma treatment. As shown in Table 1, after the semiconductor material is treated with the plasma treatment, the resistance is actually decreased. Accordingly, it is proved that the plasma treatment 200 performed after the third mask process can reduce the resistances of the active layer CH and the etching stop layer ES, so as to improve the electric contact between the active layer CH and the source S and drain D and improve the electric contact between the etching stop layer and the second electrode E2.

TABLE 1

| Plasma gas (power) | Resistance before the plasma treatment (Ω/□) | Resistance after the plasma treatment (Ω/□) |
|---|---|---|
| Argon gas (1 kW) | 6.1E5 | 9.1E2 |
| Argon gas (0.8 kW) | | 6.6E3 |
| Oxygen gas (1 kW) | | 8.3E2 |
| Oxygen gas (0.8 kW) | | 5.4E3 |
| Helium gas | 9E4 | 4.3E3 |

The disclosure adopts the etching selectivity between the semiconductor material and the insulating material to protect the active layer of the semiconductor layer from etching damage so as to keep original electric characteristic of the active layer. In addition, the quality of the capacitor can also be controlled through the arrangement of an etching stop layer of the semiconductor layer.

The semiconductor device described in the above mentioned exemplary embodiments can be applied to a display device (such as a liquid crystal display device, an organic electroluminescence device, an electro-wetting display device, an electrophoresis display device or other type display devices), a driving device (such as source driving device, a gate driving device or other driving devices), or an electronic device with thin film transistors and capacitors.

It will be apparent to those skilled in the art that various modifications and variations can be made to the structure of the disclosed exemplary embodiments without departing from the scope or spirit of the disclosure. In view of the foregoing, it is intended that the disclosure cover modifications and variations of this disclosure provided they fall within the scope of the following claims and their equivalents.

What is claimed is:
1. A semiconductor device, comprising:
a gate and a first electrode, located on a substrate;
a first insulating layer, covering the gate and the first electrode;
an active layer and an etching stop layer, disposed on the first insulating layer above the gate and the first electrode respectively;
a second insulating layer, covering the active layer and the etching stop layer, wherein the second insulating layer has a first opening, a second opening and a third opening, the first opening and the second opening expose the active layer, and the third opening exposes the etching stop layer and is located above the first electrode;
a source and a drain, disposed on the second insulating layer and contacting with the active layer through the first opening and the second opening respectively;
a second electrode, located on the second insulating layer and contacting with the etching stop layer through the third opening, wherein the active layer is between the gate and the source and the drain, and the etching stop layer is disposed between the second electrode and the first electrode; and a protecting auxiliary layer, comprising a first protecting pattern layer located on the active layer and a second protecting pattern layer located on the etching stop layer, wherein the first opening and the second opening pass through the first protecting pattern layer, and the third opening passes through the second protecting pattern layer, such that the first protecting pattern layer contacts with the source and the drain, and the second protecting pattern layer contacts with the second electrode, and wherein each of side-walls of the first protecting pattern layer is respectively aligned with one of side-walls of the active layer, and each of side-walls of the second protecting pattern layer is respectively aligned with one of side-walls of the etching stop layer, and wherein the protecting auxiliary layer and the second insulating layer have different patterns.

2. The semiconductor device as claimed in claim 1, wherein a material of the active layer is the same to a material of the etching stop layer.

\* \* \* \* \*